United States Patent
Gidon et al.

(10) Patent No.: US 6,891,242 B2
(45) Date of Patent: May 10, 2005

(54) PHOTODETECTOR MATRIX WITH PIXELS ISOLATED BY WALLS, HYBRIDIZED ONTO A READING CIRCUIT

(75) Inventors: Pierre Gidon, Echirolles (FR); Philippe Pantigny, Claix (FR)

(73) Assignee: Commissariat a l'Energie Atomique, Paris (FR)

(*) Notice: Subject to any disclaimer, the term of this patent is extended or adjusted under 35 U.S.C. 154(b) by 0 days.

(21) Appl. No.: 10/479,966

(22) PCT Filed: Apr. 10, 2003

(86) PCT No.: PCT/FR03/01139
§ 371 (c)(1),
(2), (4) Date: Dec. 11, 2003

(87) PCT Pub. No.: WO03/088359
PCT Pub. Date: Oct. 23, 2003

(65) Prior Publication Data
US 2004/0173863 A1 Sep. 9, 2004

(30) Foreign Application Priority Data
Apr. 12, 2002 (FR) .............................. 02 04617

(51) Int. Cl.$^7$ ................. H01L 27/148; H01L 33/00; H01L 31/62; H01L 31/113; H01L 31/00

(52) U.S. Cl. ................. 257/443; 257/444; 257/222; 257/88; 257/293

(58) Field of Search .......................... 257/88, 222, 296, 257/293, 444

(56) References Cited

U.S. PATENT DOCUMENTS

| | | |
|---|---|---|
| 5,075,238 A | 12/1991 | Solomon |
| 5,602,414 A | 2/1997 | Mitsui et al. |
| 5,729,020 A | 3/1998 | Matsushita et al. |
| 6,018,169 A * | 1/2000 | Tohyama ............ 257/222 |
| 6,809,008 B1 * | 10/2004 | Holm et al. ............ 438/455 |

FOREIGN PATENT DOCUMENTS

| | | |
|---|---|---|
| JP | 63281460 | 11/1988 |
| JP | 2001291892 | 10/2001 |

* cited by examiner

*Primary Examiner*—Cuong Nguyen
(74) *Attorney, Agent, or Firm*—Oblon, Spivak, McClelland, Maier & Neustadt, P.C.

(57) ABSTRACT

An array of photodetectors intended to be hybridized on a readout circuit and fabricated from a wafer in semiconductor material. The wafer is divided into pixels, the pixels being separated from one another by walls formed crosswise over the entire thickness of the wafer, the hybridization surface having connection pads enabling hybridization of the photodetector array to the readout circuit.

18 Claims, 18 Drawing Sheets

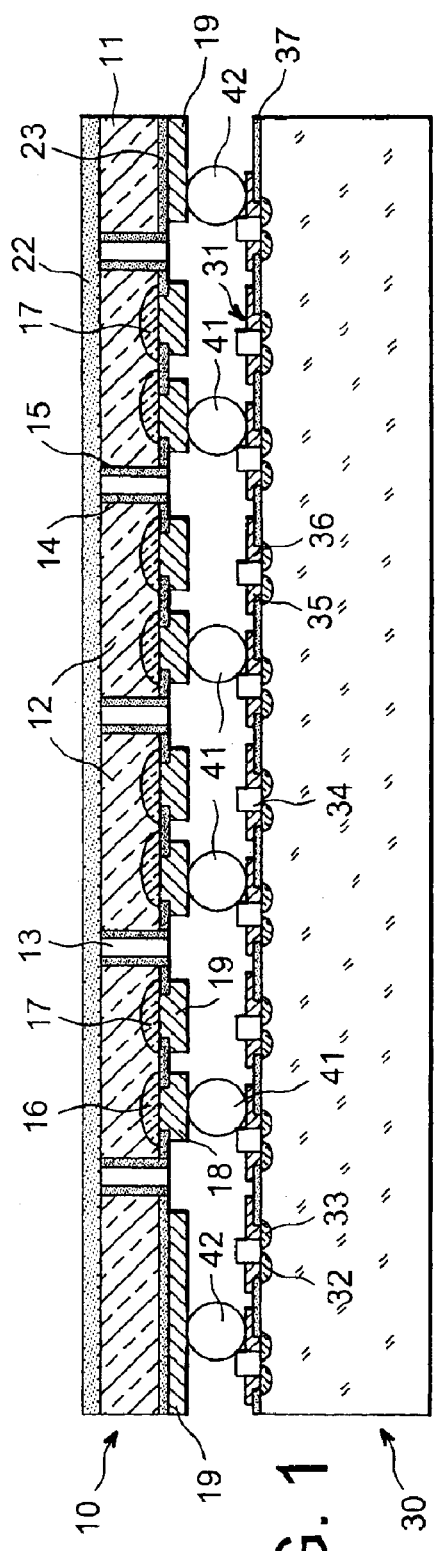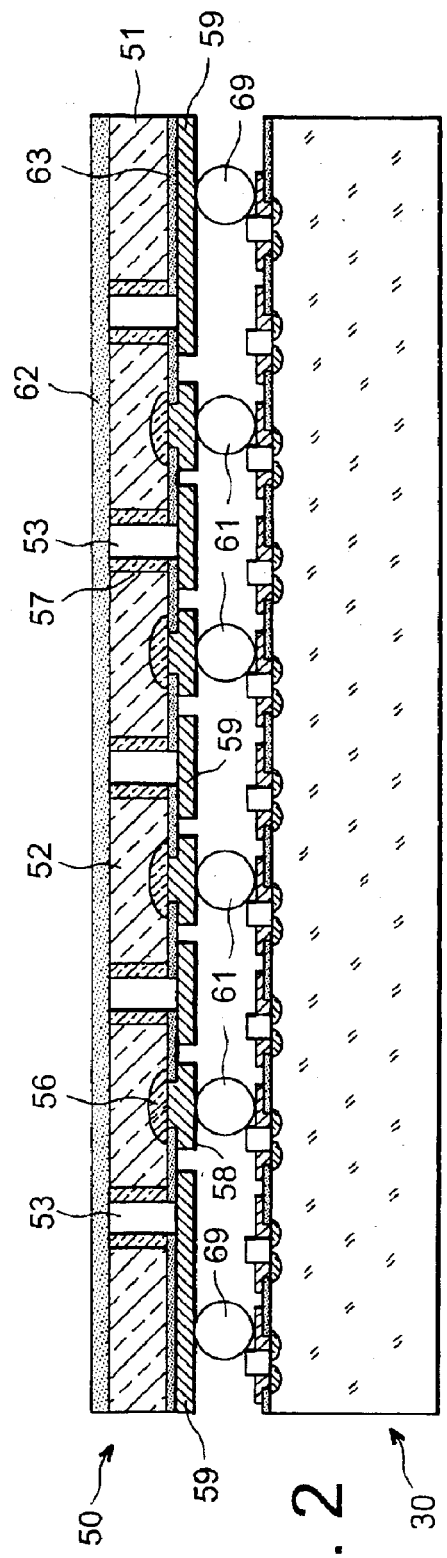

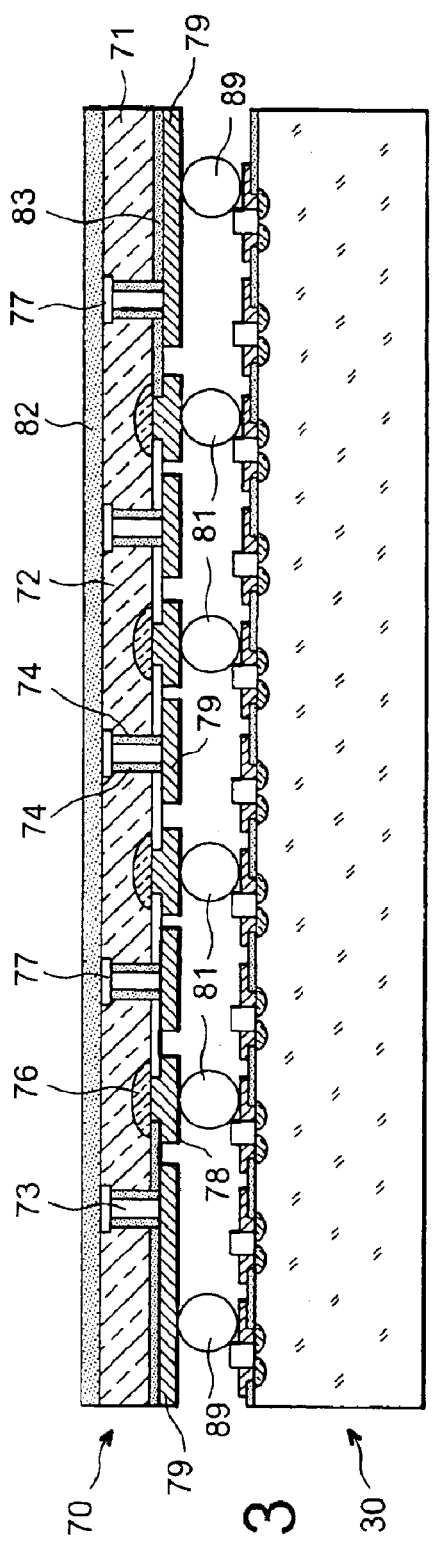
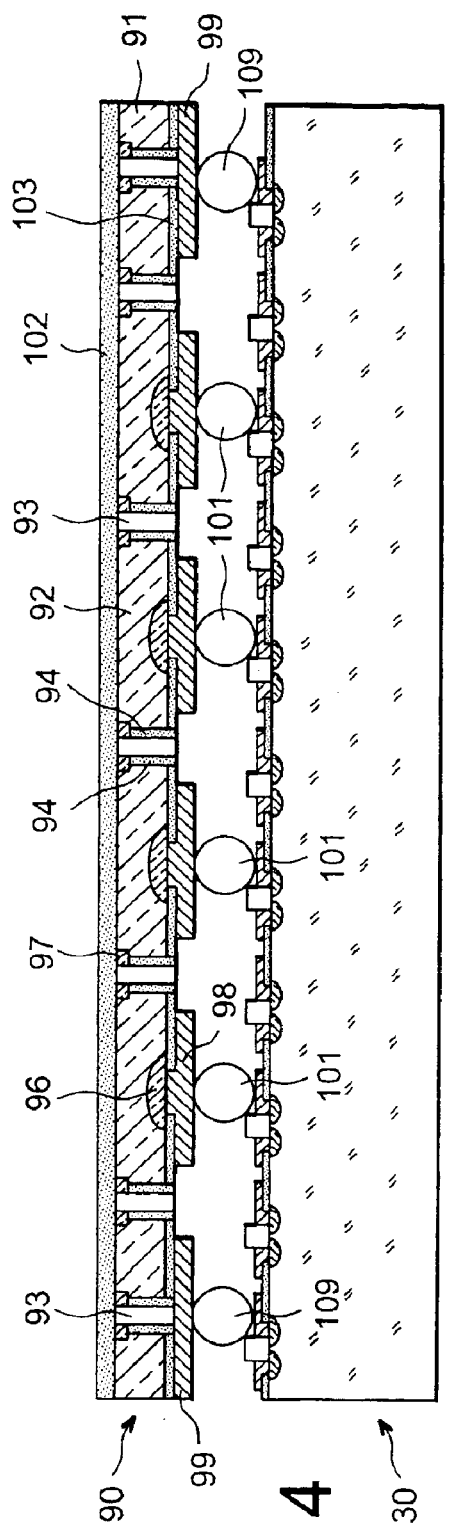
FIG. 3
FIG. 4

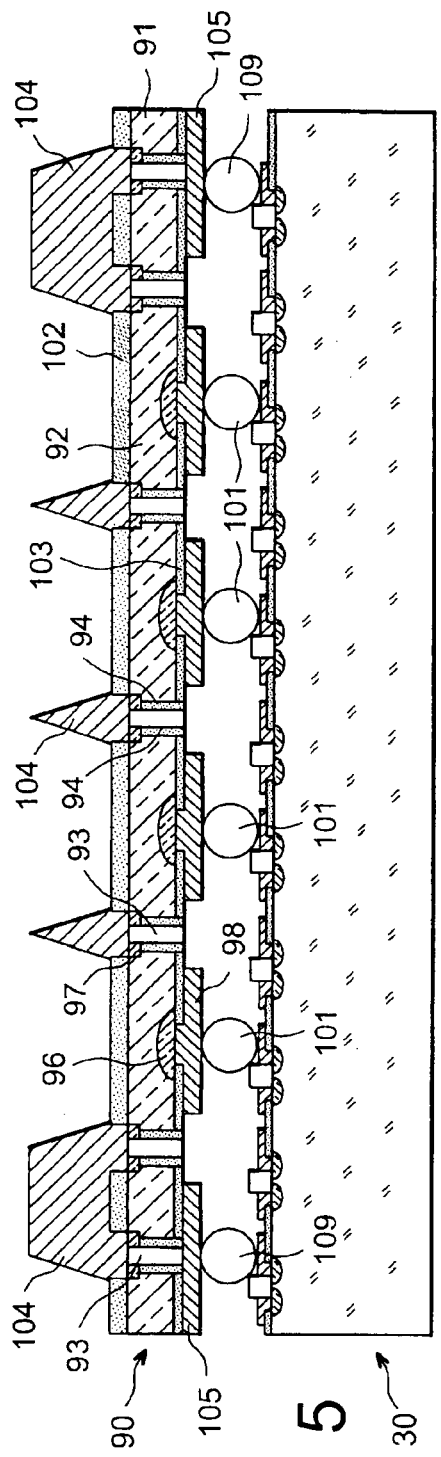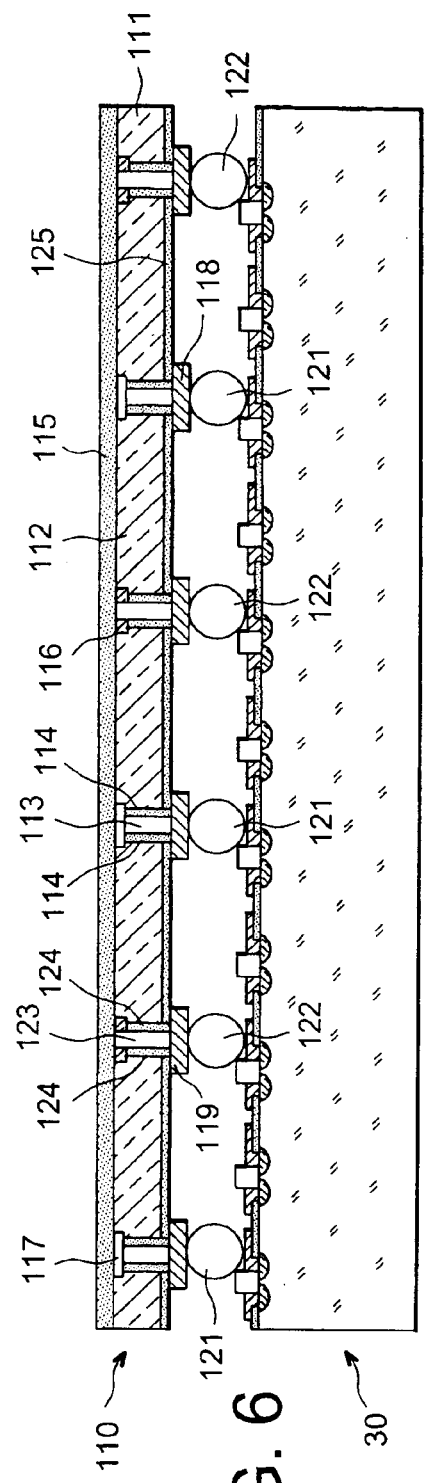

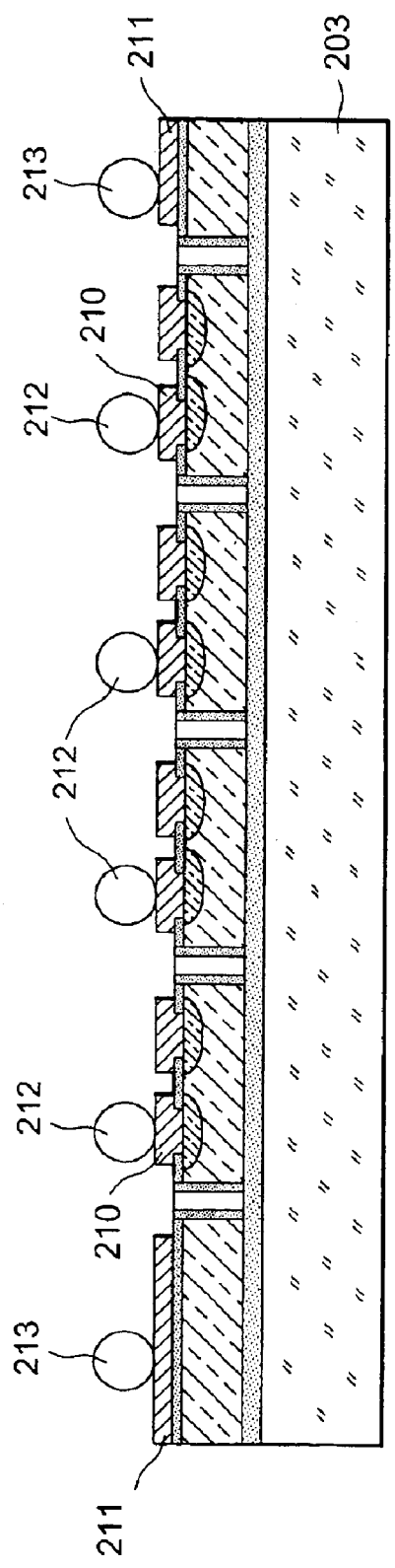
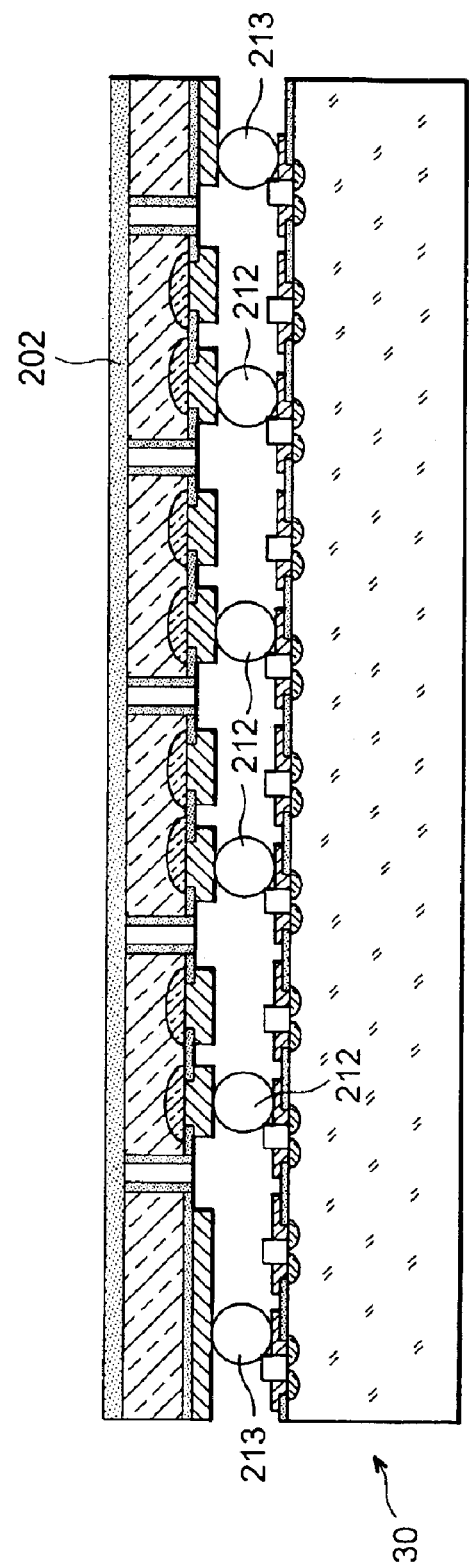
FIG. 9I
FIG. 9J

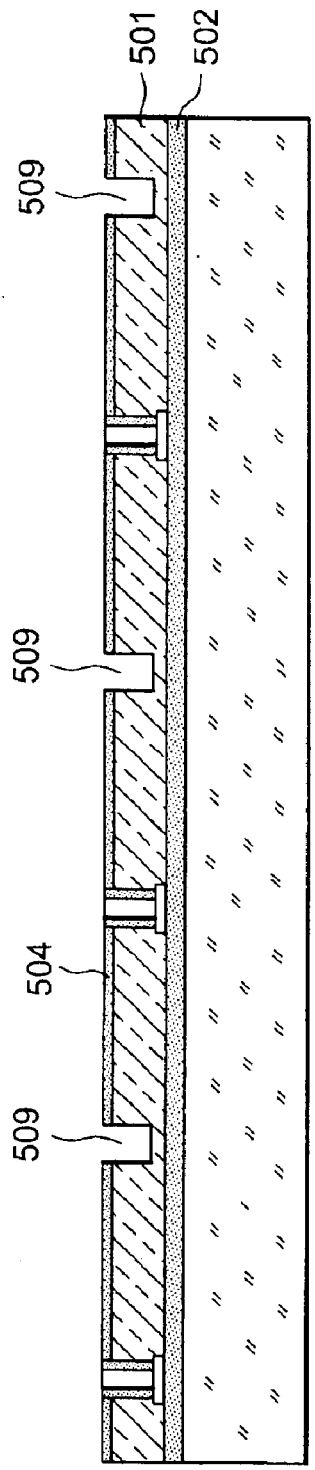
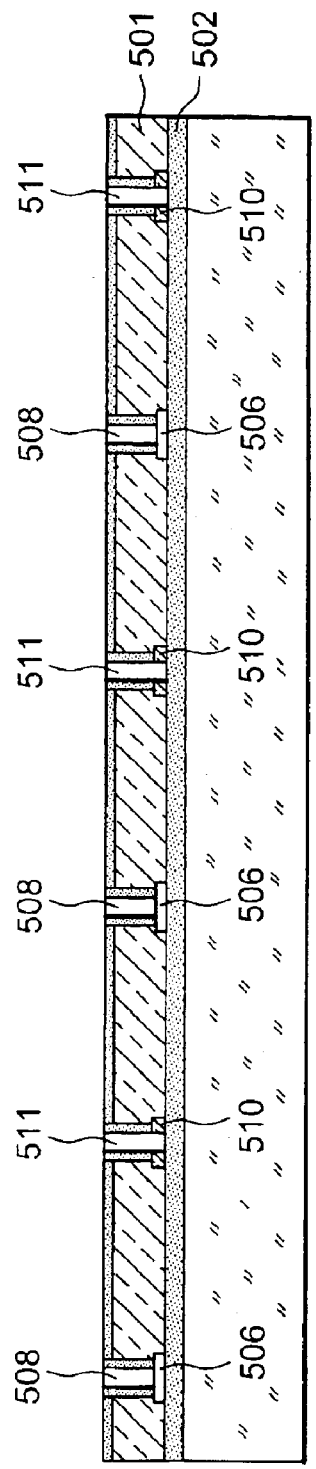
FIG. 13C
FIG. 13D

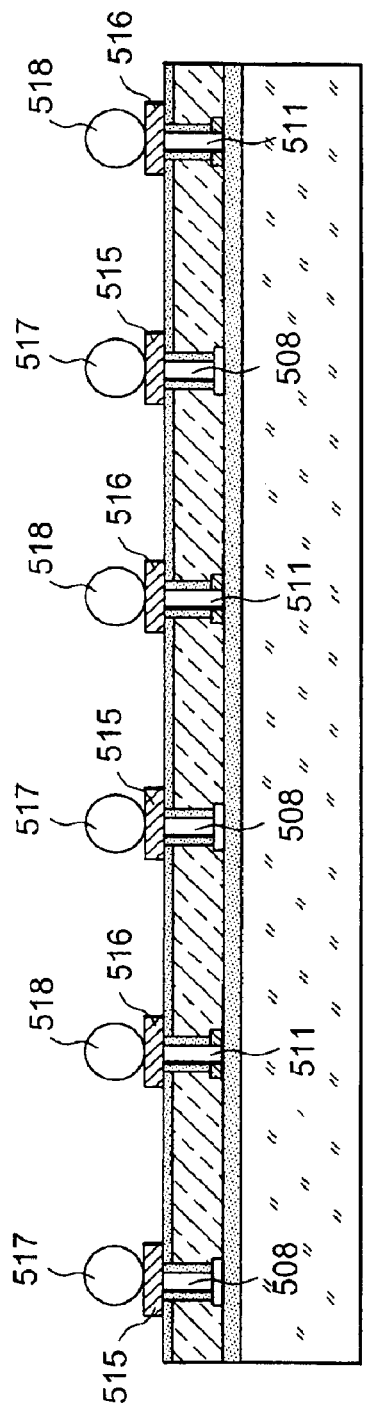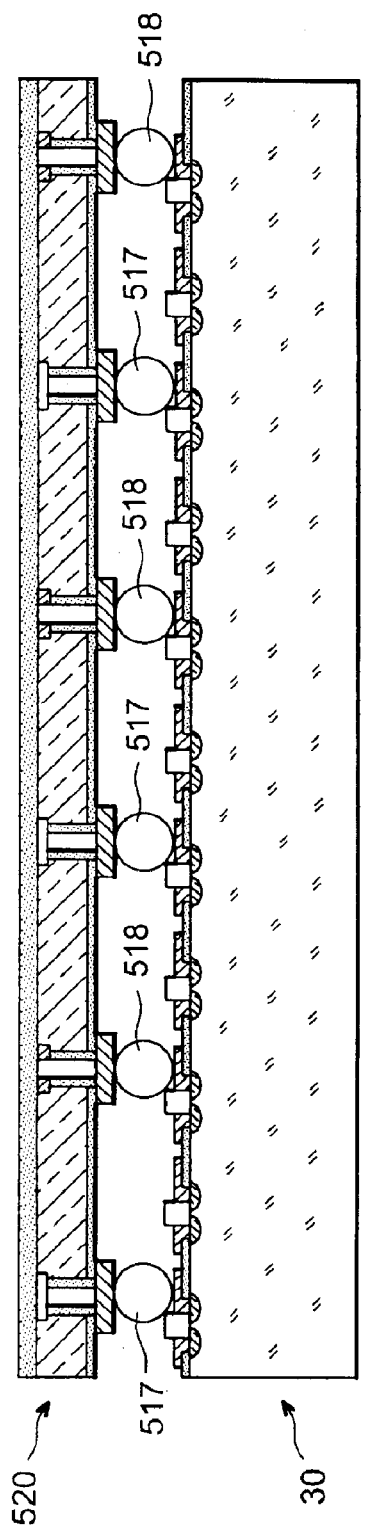
FIG. 13E
FIG. 13F

PHOTODETECTOR MATRIX WITH PIXELS ISOLATED BY WALLS, HYBRIDIZED ONTO A READING CIRCUIT

TECHNICAL FIELD

The invention concerns an array of photodetectors, with wall-insulated pixels, hybridised on a readout circuit.

The most frequent purpose of detector arrays is to re-transcribe images. They may also be used to capture light signals derived from measuring equipment. The light spectrum processed by them may range from the infrared to the ultraviolet. They deliver electric signals in relation to received light intensity. Some deliver several signals in parallel, either to transmit information more rapidly, or to separate the signals derived from different colour filters (and hence of different wavelength).

PRIOR ART

Multiple structures of photodetector arrays exist.

Hybrid photodetector structures are known comprising an array of photodiodes with a common electrode fabricated simultaneously in a wafer of semiconductor material. This wafer is hybridised on an amplifying circuit and thinned if necessary.

The different photodiodes fabricated in the wafer of semiconductor material are not separated from one another electrically or optically. Solely the resistivity of the semiconductor material and electric contact distance are responsible for collection of the generated photocurrent by one connection pad or another.

DISCLOSURE OF THE INVENTION

In the present invention it is proposed to optimise the detection performances of photodetector arrays through the presence of walls separating the different photodetectors in an array of photodetectors.

The subject of the invention is therefore an array of photodetectors intended to be hybridised on a readout circuit and consisting of a wafer in semiconductor material having one surface receiving light to be detected and an opposite so-called hybridisation surface, the wafer being divided into pixels, each pixel forming a photodetector, the hybridisation surface having connection pads with which to hybridise the array of photodetectors to the readout circuit, characterized in that the pixels are separated from one another by walls formed crosswise over the entire thickness of the wafer.

The walls formed crosswise direction in the wafer may be perpendicular to the wafer and form a rectangular or square lattice network. They may also be inclined relative to the wafer. They may form a lattice network in prism, cone shape, etc.

According to one first preferred embodiment, each photodetector comprises a zone doped according to a first doping type and in electric contact with a corresponding connection pad on the hybridisation surface, each photodetector also comprising a zone doped according to a second doping type complementary to the first doping type and in electric contact with an electrode common to all the photodetectors and carried by the hybridisation surface, the walls having a wall surface electrically insulated from the photodetectors.

Each photodetector may also comprise a zone doped according to a first doping type and in electric contact with a corresponding connection pad on the hybridisation surface, each photodetector also comprising a zone doped according to a second doping type complementary to the first doping type and in electric contact with a corresponding connection pad on the hybridisation surface, the walls having a wall surface electrically insulated from the photodetectors.

According to a second preferred embodiment, each photodetector comprises a zone doped according to a first doping type and in electric contact with a corresponding connection pad on the hybridisation surface, each photodetector also comprising a zone doped according to a second doping type complementary to the first doping type and in electric contact with electric conductor means of the walls, the wall electric conductor means being connected to a common electrode.

The common electrode may be carried by the hybridisation surface of the array of photodetectors.

The zone doped according to the second doping type may extend throughout the entire thickness of the wafer in semiconductor material. Each photodetector may also comprise a layer of the wafer in semiconductor material, adjacent to the light receiving surface, doped according to the second doping type.

According to one variant of embodiment, for walls having a summit which does not reach the light receiving surface, the zone doped according to the second doping type is located between said summit and the light receiving surface.

According to another variant of embodiment, the zone doped according to the second doping type is located close to the light receiving surface.

According to a further variant of embodiment, said common electrode is carried by the light receiving surface, electric connection means passing through the wafer in semiconductor material to connect said common electrode to a conductor band located on the hybridisation surface. Preferably, the common electrode comprises electric conductors having a shape allowing reflection of the light to be detected towards the portions of the receiving surface devoid of electric conductors. This shape of the electric conductors can be a point directed towards the light to be detected.

According to a third preferred embodiment, each photodetector comprises a zone doped according to a first doping type and a zone doped according to a second doping type complementary to the first doping type, these doped zones being located close to the light receiving surface and being connected to corresponding connection pads on the hybridization surface via electric conductor means provided in the walls. The zones doped according to a first doping type may correspond to walls whose summit does not reach the light receiving surface, the zones doped according to the first doping type then being located between the wall summits and the light receiving surface, the zones doped according to the second doping type corresponding to walls having a summit which reaches the light receiving surface. The doped zones may correspond to walls having a summit which does not reach the light receiving surface, the doped zones then being located between the summits of the walls and the light receiving surface. The doped zones may also correspond to walls having a summit which reaches the light receiving surface.

Optionally, the light receiving surface carries at least one optic member. The optic member may be a member chosen from among an antireflection layer, a coloured filter and a light concentration system.

SHORT DESCRIPTION OF THE DRAWINGS

The invention will be better understood and other advantages and specificities will become apparent on readouting the following description given as a non-restrictive example accompanied by the appended drawings among which:

FIG. 1 is a cross-section view of an array of photodetectors hybridised on a readout circuit, according to a first embodiment of the invention, FIG. 2 is a cross-section view of an array of photodetectors hybridised on a readout circuit, according to a second embodiment of the invention, FIG. 3 is a cross-section view of an array of photodetectors hybridised on a readout circuit according to a first variant of a third embodiment of the invention, FIG. 4 is a cross-section view of an array of photodetectors hybridised on a readout circuit, according to a second variant of the third embodiment of the invention, FIG. 5 is a cross-section view of an array of photodetectors hybridised on a readout circuit according to a fourth embodiment of the invention, FIG. 6 is a cross-section view of an array of photodetectors hybridised on a readout circuit according to a fifth embodiment of the invention, FIGS. 7 and 8 are cross-section views of an array of photodetectors hybridised on a readout circuit according to a fourth embodiment of the invention, completed with an optic member, FIGS. 9A to 9J illustrate the fabrication of an array of photodetectors hybridised on a readout circuit according to the first embodiment of the invention FIGS. 10A to 10D illustrate the fabrication of an array of photodetectors hybridised on a readout circuit according to the second embodiment of the invention, FIGS. 11A to 11H illustrate the fabrication of an array of photodetectors hybridised on a readout circuit according to the variants of the third embodiment of the invention, FIGS. 12A and 12B illustrate the fabrication of an array of photodetectors hybridised on a readout circuit according to the fourth embodiment of the invention, FIGS. 13A to 13F illustrate the fabrication of an array of photodetectors hybridised on a readout circuit according to the fifth embodiment of the invention.

DETAILED DESCRIPTION OF EMBODIMENTS OF THE INVENTION

FIG. 1 is a cross-sectional view of an array of photodetectors hybridised on a readout circuit according to a first embodiment of the invention. The array of photodetectors is an array having the two electric nodes of the photodetecter dipole on the circuit surface.

The array of photodetectors 10 consists of a wafer in semiconductor material 11 divided into pixels or photodetectors 12 by walls arranged crosswise relative to wafer 11 and across its entire thickness. The walls therefore form a lattice network. They may consist of one or more materials, at least the wall material in contact with the semiconductor material of the photodetectors being electrically insulating. In the case shown in FIG. 1, the walls have a surface 13 sandwiched between two electrically insulating surfaces 14 and 15.

Each pixel 12 comprises two complementary doped zones to achieve contacting between the metal and the semiconductor and the collection of charges. Doped zone 16 ensures contacting with connection pad 18 of the photodetector. Doped zone 17 ensures contacting with electrode 19 which is an electrode common to all the photodetectors.

The array of photodetectors 10, on its surface intended to receive light to be detected, is coated with an electrically insulating layer that is transparent 22. On its hybridisation surface it is coated with an electrically insulating later 23 opened locally to ensure the various electric connections.

FIG. 1 also shows a readout circuit 30 associated with the photodetector array 10. Readout circuit 30 is fabricated on a silicon substrate. In known manner amplifiers and CMOS (or bipolar or BiCMOS) processing circuits 31 were fabricated on the substrate. By way of example the figure shows P or N doping zones 32 and 33, polysilicon gates 34, drain and source contacts 35 and 36 and an etched silicon oxide layer 37.

Hybridisation of the array of photodetectors 10 on readout circuit 30 is made using fusible balls. Connection pads 18 of the photodetectors are connected to the readout circuit by balls 41. Common electrode 19 is connected to the readout circuit via balls 42.

One of the advantages of this embodiment is that the electric signal generated opposite each pair of electric contacts 18, 19 is necessarily captured by these contacts and cannot drift towards neighbouring photodetector contacts. Images hence have better resolution and glare spots due to intense point sources are reduced. Electrode 19 is electrically connected to readout circuit 30 on the edges. It could considered to do away with the common electrode and to add one ball per electric node, for special applications of differential amplification.

FIG. 2 is a cross-section view of an array of photodetectors hybridised on a readout circuit, according to a second embodiment of the invention. The array of photodetectors is an array with common base contacts taken by the conductor walls.

The array of photodetectors 50 consists of a wafer in semiconductor material 51 divided into photodetectors 52 by walls gridding wafer 51 as in FIG. 1. The walls have a conductor surface 53.

Each photodetector 52 comprises two complementary doped zones to achieve contacting between the metal and semiconductor and charge collection. Doped zone 56, in the centre of photodetector 52, ensures electric contacting with connection pad 58 of the photodetector. Peripheral doped zone 57 ensures electric contacting with conductor surface 53 of the wall. Conductor walls 53 are all connected to a common electrode 59.

The array of photodetectors 50, on its surface intended to receive light to be detected, is coated with an electrically insulating layer that is transparent 62. On its hybridisation surface it is coated with an electrically insulating layer 63 opened locally to ensure the various electric connections.

FIG. 2 also shows a readout circuit 30 associated with the array of photodetectors 50. It is similar to the one in FIG. 1.

Hybridisation of the array of photodetectors 50 onto readout circuit 30 is made using fusible balls. Connection pads 58 of the photodetectors are joined to the readout circuit via balls 61. Common electrode 59 is joined to the readout circuit via balls 69.

The advantage of this embodiment is that it has only one connection pad per photodetector, making it more compact. Depending upon the type of radiation detected, it may be preferable to have a doped layer on the surface receiving light to be detected. In this case the dopant is of the same type as the dopant of the semiconductor zone in contact with the conductor wall.

FIG. 3 is a cross-section view of an array of photodetectors hybridised on a readout circuit according to a first variant of a third embodiment of the invention. The array of photodetectors is an array of common base contacts taken on the illuminated face at the end of the conductor wall.

The array of photodetectors 70 consists of a wafer in semiconductor material 71 divided into photodetectors 72 by walls gridding wafer 71 as in FIG. 1. The walls consist of a conductor surface 73 sandwiched between two thin electrically insulating layers 74.

The walls lead to the hybridisation surface of wafer 71 where the conductor wall surfaces 73 come into electric contact with a common electrode 79 which also extends along the edges of wafer 71. The wall summits allow portions of semiconductor material to subsist ahead of the light receiving surface of wafer 71.

The portions 77 of semiconductor material lying between the light receiving surface of wafer 71 and the summit of a wall is doped.

Each photodetector 72 has a doped zone 76 in its centre that is complementary to the doping of portions 77 and is located on the hybridisation surface of the photodetector array. Doped zones 76 are in electric contact with corresponding connection pads 78.

The array of photodetectors 70, on its surface intended to receive light to be detected, is coated with an electrically insulating, transparent layer 82. On its hybridisation surface it is coated with an electrically insulating layer 83 opened locally to ensure the various electric connections.

FIG. 3 also shows a readout circuit 30 associated with the array of photodetectors 70. It is similar to the one in FIG. 1.

Hybridisation of the array of photodetectors 70 onto readout circuit 30 is made using fusible balls. Connection pads 78 of the photodetectors are connected to the readout circuit by balls 81. The common electrode 79 is connected to the readout circuit via balls 89.

FIG. 4 is a cross-section view of an array of photodetectors hybridised on a readout circuit according to a second variant of a third embodiment of the invention. The array of photodetectors is also an array with common base contacts taken on the illuminated surface at the end of the conductor wall.

The array of photodetectors 90 consists of a wafer in semiconductor material 91 divided into photodetectors 92 by walls gridding wafer 91 as in FIG. 1. The walls consist of a conductor surface 93 sandwiched between two thin electrically insulating layers 94.

The walls lead to the hybridisation surface of wafer 91. The conductor surfaces of the walls on the edges of the wafer come into electric contact with an electrode 99 common to all the walls. The walls also lead to the light receiving surface of wafer 91.

Each photodetector 92 comprises two complementary doped zones to achieve contacting between the metal and semiconductor and charge collection. Doped zone 96, in the centre of photodetector 92, ensures electric contacting with connection pad 98 of the photodetector. Peripheral doped zone 97 located on the side of the light receiving surface, ensures electric contacting with the conductor surface 93 of the wall, this surface not being coated with thin insulating layers at this level.

The array of photodetectors, on its surface intended to receive light to be detected, is coated with an electrically insulating, transparent layer 102. On its hybridisation surface it is coated with an electrically insulating layer 103 opened locally to ensure the various electric connections.

FIG. 4 also shows a readout circuit 30 associated with the array of photodetectors 90. It is similar to the one in FIG. 1.

Hybridisation of the array of photodetectors 90 onto readout circuit 30 is made using fusible balls. Connection pads 98 of the photodetectors are connected to the readout circuit via balls 101. Common electrode 99 is connected to the readout circuit via balls 109.

The structures shown in FIGS. 3 and 4 make it possible to reduce the volume of doped semiconductor material. This condition is often necessary since the doped zones recombine the charges created by the light within them. Contact multiplication is necessary to reduce the resistance of current collection. These two structures allow adjustment to compromise values imposed by detector materials (semiconductors) and the wavelengths to be detected.

FIG. 5 is a cross-section view of an array of photodetectors hybridised on a readout circuit according to a fourth embodiment of the invention. The array of photodetectors is an array with common contacts taken up by metal strip on the illuminated surface forming an optic micro-concentrator.

The structure shown in FIG. 5 reproduces many of the parts described in FIG. 4. These parts carry identical references. Similarly, it could even have reproduced the parts in FIG. 2 or 3 as variants.

Contrary to FIG. 4, the array of photodetectors in FIG. 5, on its surface receiving light to be detected, has electric conductors 104 forming a common electrode connected to doped zones 97. The electrically insulating, transparent layer 102 is opened locally to ensure this connection. Common electrode 104 is electrically connected to conductor bands 105 arranged along the edge of the wafer and on the hybridisation surface for example by means of the wall conductor surfaces 93 also located on the edge of the wafer. Conductor bands 109 are connected to readout circuit 30 via balls 109. If wall surfaces 93 are electrically insulating, then common electrode 104 may be connected to circuit 30 via a connection wire on the edge of the circuit.

The array of photodetectors in FIG. 5 shows a common electrode 104 known to be electrically advantageous. However, it is advantageous to impart a pointed shape to the conductors of common electrode 104 as shown in the figure. The conductor surfaces allow incident light to be reflected towards the semiconductor material, thereby minimising optic losses. A further advantage is to allow the electric connection points to be positioned on the edge of the wafer on the illuminated surface. This arrangement simplifies the final assembly of the component in a device.

FIG. 6 is a cross-section view of an array of photodetectors hybridised on a readout circuit according to a fifth embodiment of the invention. The array of photodetectors is an array with contacts via the walls with the bases and emitters transferred to the illuminated surface.

For some wavelengths, light generates electric charges as soon as it meets the first layers of semiconductor material. It is therefore preferable to have all the doped zones of the semiconductor material close to the illuminated surface to collect the charges as quickly as possible. The structure shown in FIG. 6 can achieve this. For this purpose a triple set of walls is made successively in the wafer of semiconductor material. The first set contains one of the dopants, the second set contains the other dopant and the third set is electrically insulating. The third set is not shown FIG. 6 since it is perpendicular to the walls shown in this cross-section.

The array of photodetectors 110 consists of a wafer in semiconductor material 111 divided into photodetectors 112 by walls gridding wafer 111.

FIG. 6 shows two sets of walls arranged alternately. A first set of walls visible in this figure consists, as in FIG. 3, of an electrically conducting wall 113 sandwiched between two thin electrically insulating layers 114 and comes into electric contact with a superficial zone 117 of semiconductor material doped according to a first doping type. Doped zone 117 is located on the side of the surface receiving light to be detected. A second set of walls visible in this figure consists, as in FIG. 4, of an electrically conducting wall 123 sandwiched between two thin electrically insulating layers 124 with the exception of its end close to the surface receiving light to be detected. At this level, conductor wall 123 is in electric contact with a localised zone 116 of semiconductor material doped according to a second doping type complementary to the first doping type.

Conductor walls 113, on the side of the hybridisation surface, are connected to pads 118. Conductor walls 123, on the side of the hybridisation surface, are connected to pads 119.

The array of photodetectors 140, on its surface intended to receive light to be detected, is coated with an electrically insulating, transparent layer 115. On its hybridisation surface it is coated with an electrically insulating layer 125 opened locally to ensure the various electric connections.

FIG. 6 also shows a readout circuit 30 associated with the array of photodetectors 110. It is similar to the one in FIG. 1.

Hybridisation of the array of photodetectors 110 onto readout circuit 30 is made by means of fusible balls. Connection pads 118 of the photodetectors are connected to the readout circuit via balls 121. Connection pads 119 are connected to the readout circuit via balls 122.

Since the connection pads are at pixel limits, they are therefore common to two pixels. The number of contacts required for the CMOS circuit to readout information is greater than with the preceding structures as no contact is connected to a single pixel.

FIGS. 7 and 8 are cross-section views of an array of photodetectors hybridised on a readout circuit, completed by an optic member.

The photodetector arrays shown in these figures are arrays 90 illustrated in FIG. 5, but the other arrays described may be used. These arrays are associated with readout circuit 30.

Optic members such as antireflection layers, filters coloured uniformly or in zones depending upon pixels, light concentration systems may be deposited or formed on the entire surface or point added and bonded. FIG. 7 shows an optic member 5 formed on the entire surface of photodetector array 90. FIG. 8 shows an optic member 6 point-bonded onto photodetector array 90.

Several arrays of photodetectors may be fabricated simultaneously and added simultaneously onto CMOS readout circuits.

The fabrication of the above described structures will now be described. The pixels described are of rectangular shape but triangular, hexagonal or even variable-sized pixels can be contemplated depending upon the constraints of the assembly of the measuring or imaging system.

FIGS. 9A to 9J illustrate the fabrication of an array of photodetectors hybridised on a readout circuit according to the first embodiment of the invention. FIGS. 9A to 9H illustrate the fabrication of the array of photodetectors only. FIGS. 9I and 9J illustrate hybridisation of the array of photodetectors onto its readout circuit. All these figures give cross-sectional views.

FIG. 9A shows a SOI (Silicon-On-Insulator) substrate 200 consisting of a silicon carrier 203 successively carrying a layer of silicon oxide 202 and a thin silicon layer 201.

Thin silicon layer 201 undergoes an oxidation step to obtain a surface passivation and protection layer 204 (see FIG. 9B). The thickness of layer 204 is in the order of 0.5 $\mu$m.

Channels are then made in thin layer 201. First a layer of resin is deposited on oxide layer 204 and is photolithographed to etch oxide layer 204 at the desired channel positions. After etching oxide layer 104 the resin is removed. Channels 205 are then etched in thin silicon layer 201 as far as oxide layer 202. This is shown in FIG. 9C.

Surface oxidation is then conducted of the portions of apparent silicon to obtain a continuous layer of surface oxidation 204–206 in thin silicon layer 201. The channels are then filled with polysilicon 207, mechanical-chemical polishing being performed to remove surface polysilicon. This is shown in FIG. 9D.

The pixels being so delimited, doped zones can be made in the semiconductor material.

Figure 9A:
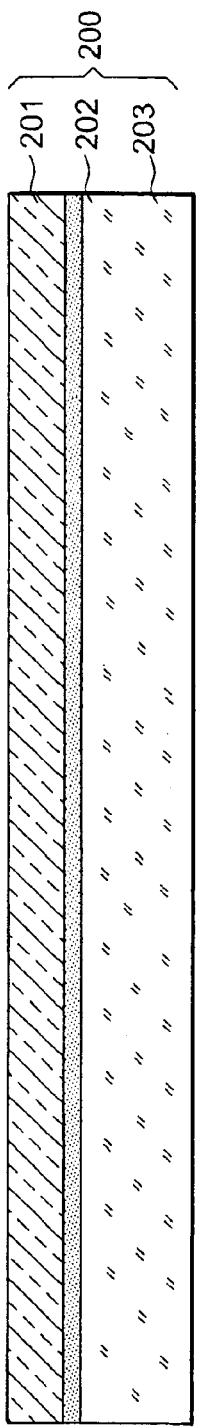
FIG. 9E shows the result obtained, with a view to creating first doped zones, after conducting the operations of depositing a resin layer, resin photolithography, etching of oxide layer 204, implanting of dopants in zones 218 of exposed photoconductor material and resin removal.
FIG. 9F shows the result obtained, with a view to creating second doped zones, after conducting the operations of depositing a further resin layer, resin photolithography, further etching of oxide layer 204, implanting of complementary dopants in zones 219 of exposed semiconductor material and resin removal.
FIG. 9G shows the result obtained after partial deoxidisation of previously doped zones and after diffusion annealing and dopant activation. Pixels are obtained having complementary doped zones 208 and 209.
Figure 9B:
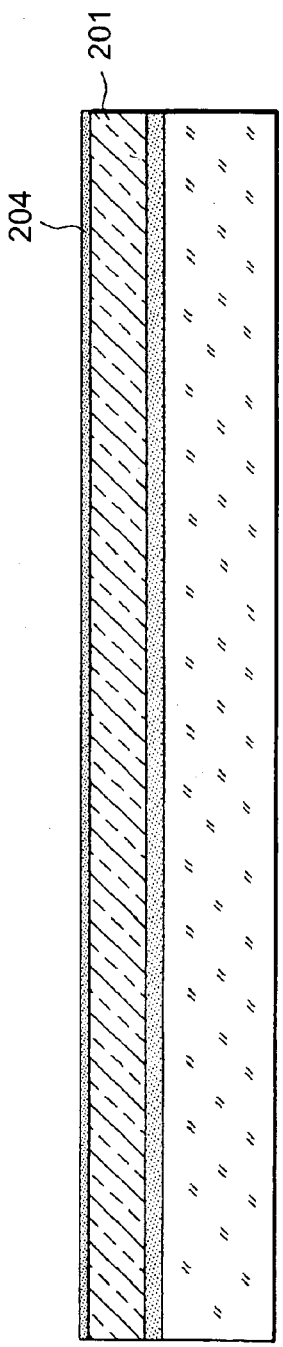
Figure 9C:
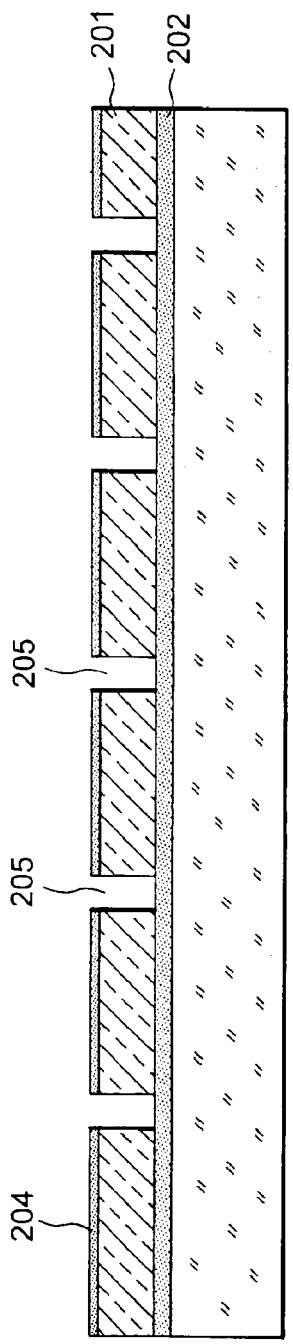
Figure 9D:
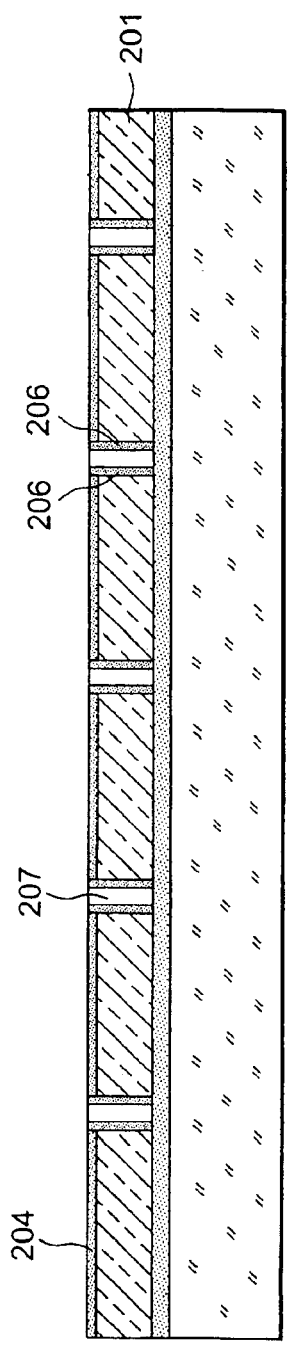
Figure 9E:
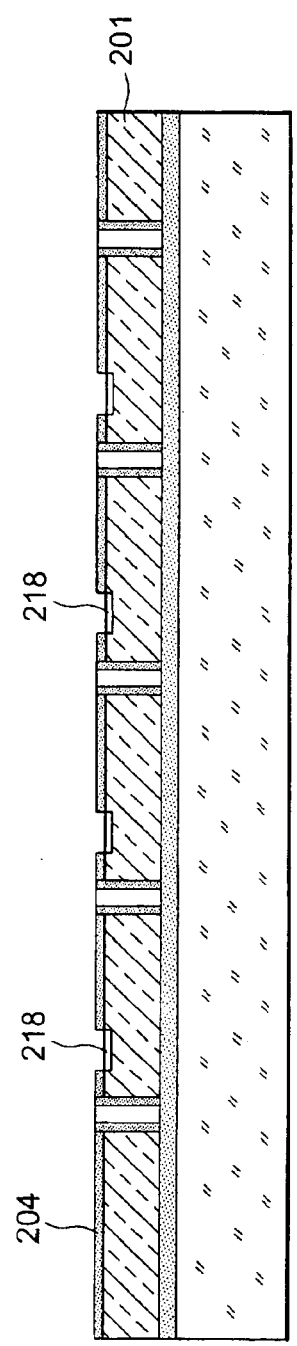
Figure 9F:
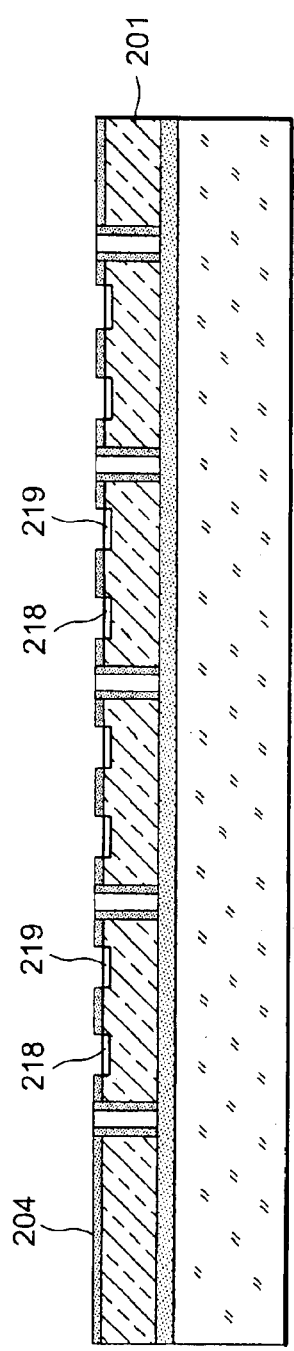
Figure 9G:
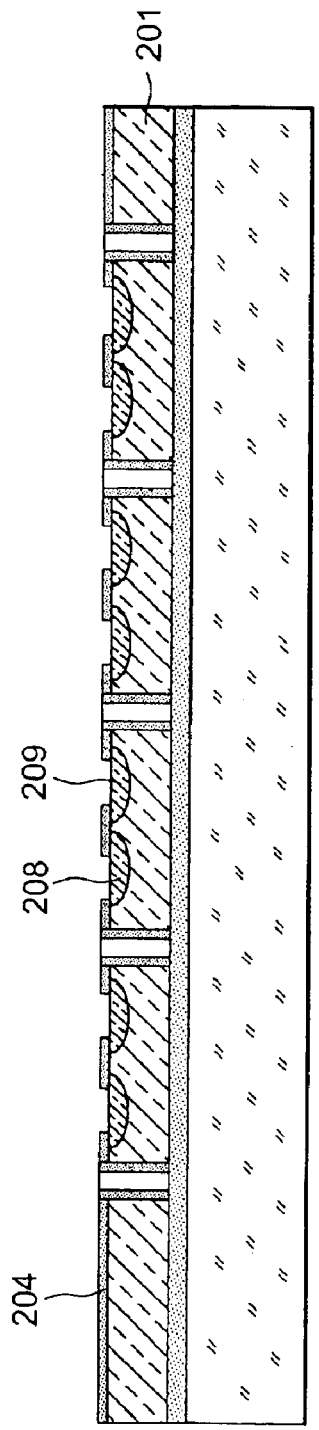
Figure 9H:
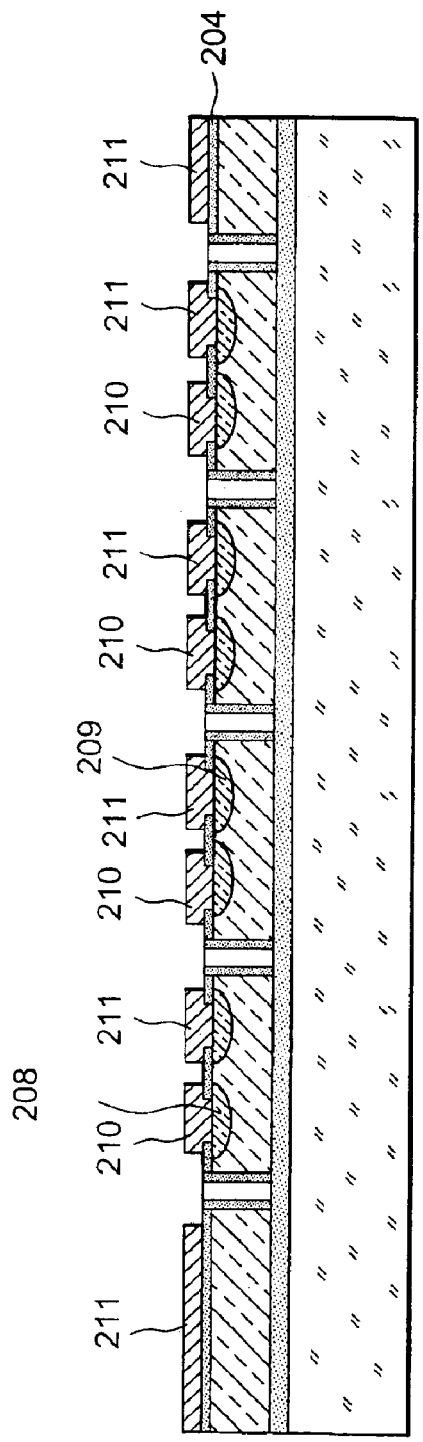

FIG. 9H shows the result obtained after depositing a metal layer followed by deposition of a resin layer, resin photolithography, etching of the metal layer and resin removal. Individual connection pads 210 are obtained connecting doped zones 208 and a common electrode 211 connecting all doped zones 209 and comprising bands along the edge of the wafer.

FIG. 9I shows the result obtained after forming conductor balls 212 on connection pads 210 and conductor balls 213 on the edge bands of electrode 211. Another method is to form fusible balls on the readout circuit.

FIG. 9J shows the structure finally obtained after the following operations:
  hybridisation of the device in FIG. 9I, using a "flip-chip" type technique, onto readout circuit 30 already described,
  optionally filling between balls 212 and 213 if necessary (not shown in the figure)
  removal of the silicon carrier 203 (see FIG. 9I) by polishing and/or etching stopping at buried silicon layer 202.

FIGS. 10A to 10D illustrate the fabrication of an array of photodetectors hybridised on a readout circuit according to the second embodiment of the invention. All these figures give cross-sectional views.

For this second embodiment, the first steps are identical to those illustrated in FIGS. 9A to 9C.

Figure 10A:
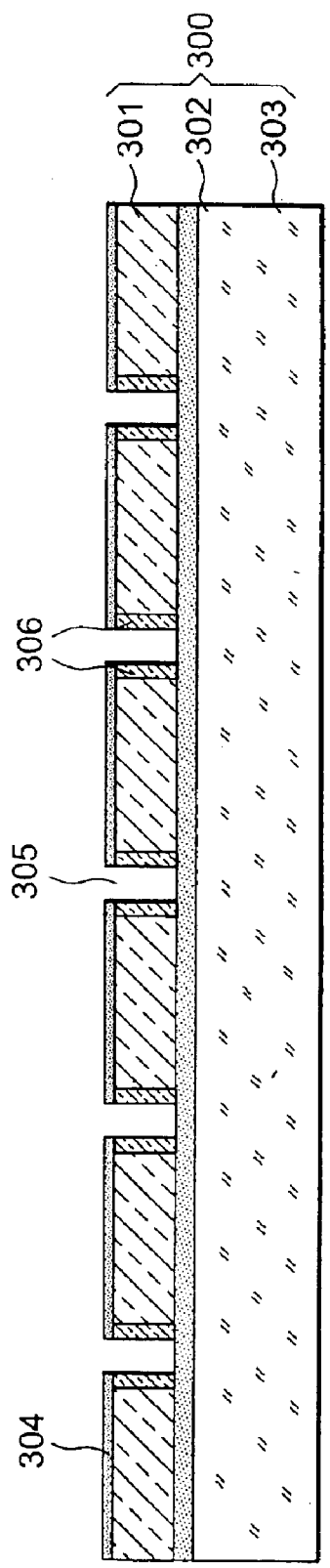

FIG. 10A shows the result obtained after doping the exposed silicon followed by diffusion annealing. Reference 300 denotes the initial SOI substrate consisting of a silicon carrier 303 successively carrying a layer of silicon oxide 302 and a thin silicon layer 301. Reference 304 denotes the surface passivation and protection layer. Reference 305 denotes the channels. Reference 306 denotes the doped zones made according to a first doping type, for example by gas diffusion.

Figure 10B:
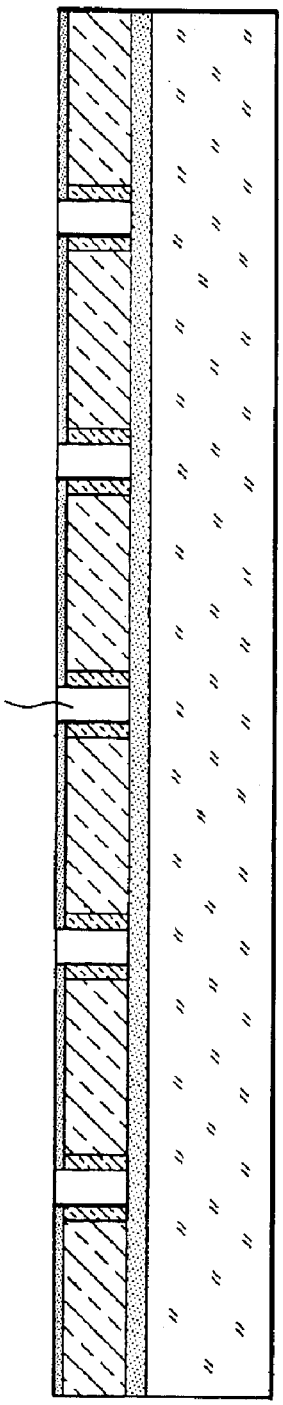

Channels 305 are then filled with doped polysilicon. Excess fill is removed by mechanical-chemical polishing. The structure shown in FIG. 10B is obtained in which reference 307 denotes the polysilicon conduction surfaces of the walls.

In one particular case it is possible, for simplification purposes, not to perform the doping step of the channel sidewalls (doped zones 306) and to allow the doped polysilicon of the conductor walls to transmit its dopants to the wall surfaces at a later stage during the diffusion step described below.

Figure 10C:
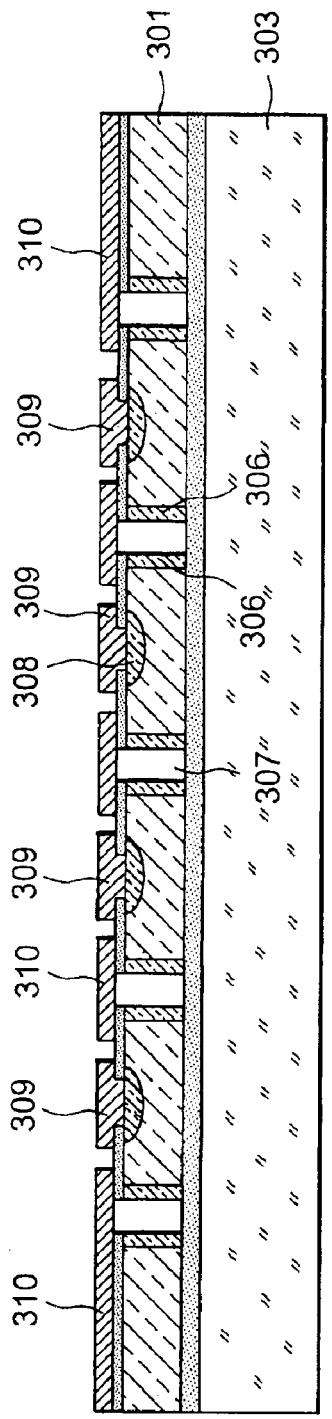

The process is then continued with steps similar to those described for the process of the first embodiment: depositing a resin layer, photolithography of the deposited resin, etching oxide layer 304, implanting a complementary dopant in thin layer 301, removing the resin, diffusion annealing and dopant activation, depositing a metal layer followed by depositing a resin layer, photolithography of the deposited resin, etching the metal layer and resin removal. The result obtained is illustrated in FIG. 10C which shows zones 308 doped with complementary dopant, special connection pads 309 in contact with doped zones 308 and electrode 310 common to all conductor walls 307.

Figure 10D:
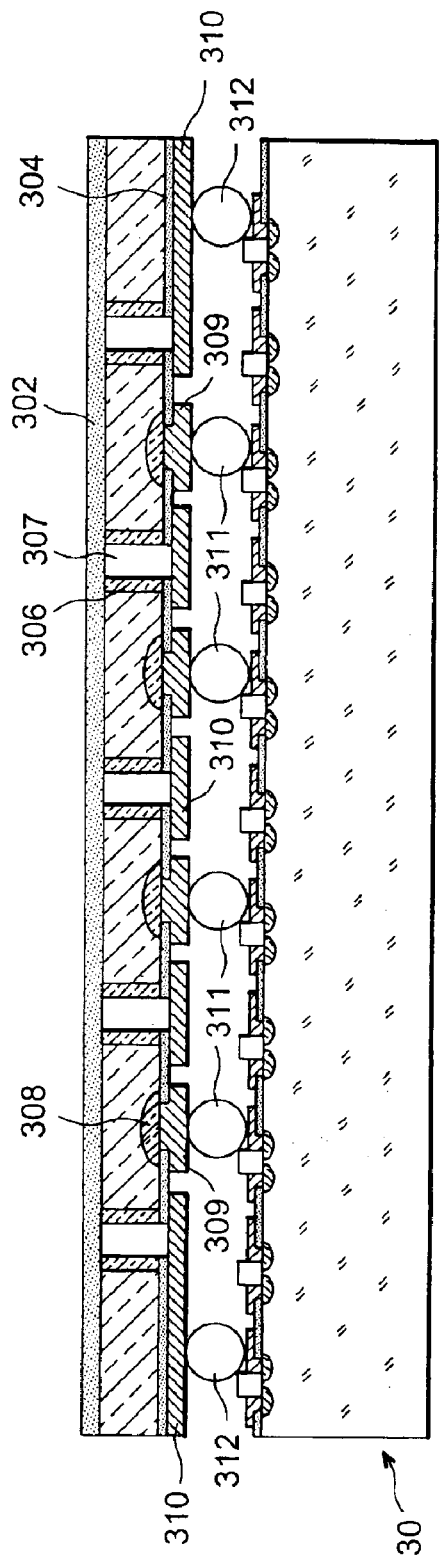

The following steps comprise the formation of fusible balls, "flip-chip' type hybridisation onto the readout circuit, optional filling between the balls, removal of the SOI carrier substrate by polishing and/or etching stopping at the buried silicon layer. The structure shown in FIG. 10D is obtained in which reference 30 denotes the readout circuit already described, reference 311 denotes the balls connecting pads 309 to the readout circuit and in which reference 312 denotes the balls connecting common electrode 310 to the readout circuit.

FIGS. 11A to 11H illustrate the fabrication of an array of photodetectors hybridised on a readout circuit according to a third embodiment of the invention. All these figures give cross-sectional views.

A SOI substrate 400 is used, consisting of a silicon carrier 403 successively carrying a buried oxide layer 402 and a thin silicon layer 401. As for the step illustrated in FIG. 9B, a surface passivation and protection layer 404 is obtained by oxidation.

Figure 11A:
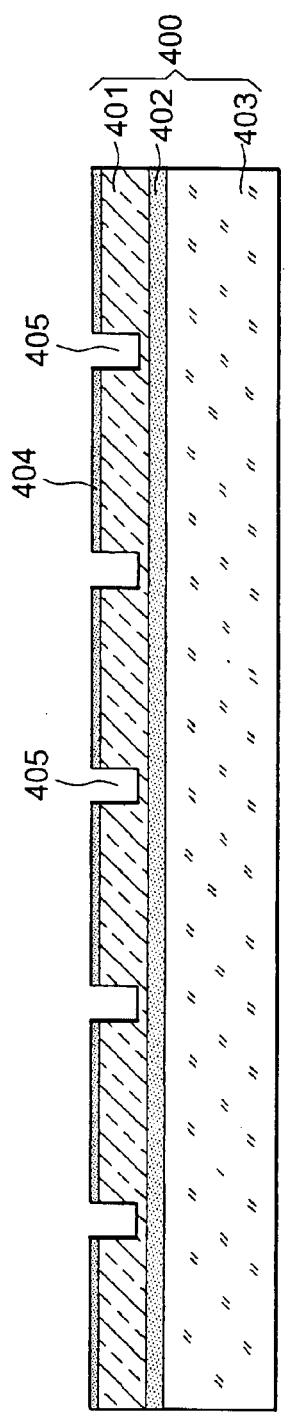

To obtain the structure shown in FIG. 11A, a resin layer is deposited on oxide layer 404 and is photolithographed. Oxide layer 404 is etched at desired locations and the resin layer is removed. Channels 405 are then etched in thin layer 401 without reaching buried layer 402.

Figure 11B:
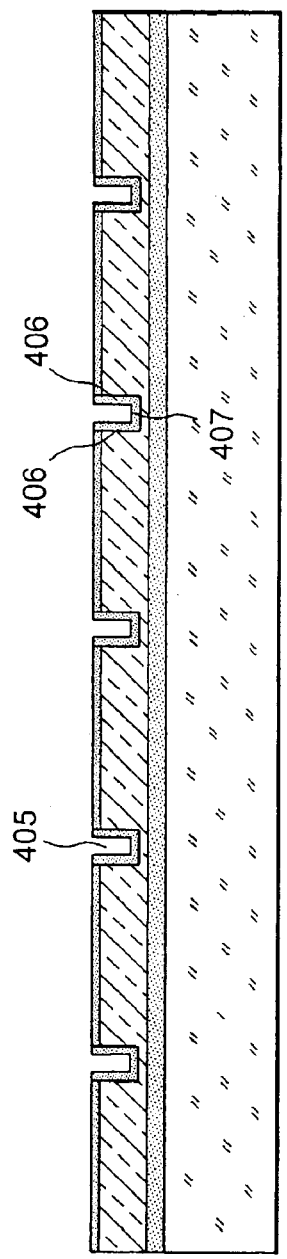

The exposed silicon surfaces are then slightly oxidised, i.e. in the channels. This is shown in FIG. 11B in which channel sidewalls 405 are coated with oxide layers 406 and in which the bottom part of these channels is coated with an oxide layer 407.

Anisotropic etching is then conducted on the oxide layer covering thin silicon layer 401. This etching is intended to remove the oxide layer located at the bottom of the channels. Oxide layer 404 is scarcely affected by this etching since its thickness is much greater than the oxide layer at the bottom of the channels. The structure shown in FIG. 11C is obtained in which channels 405 are coated with an oxide layer 406 solely on their sidewalls.

Dopants are then implanted or diffused using hot gas in the bottom of channels 405 and diffusion annealing is performed. The dopants diffuse into the silicon and not into the oxide to provide doped zones 408 as shown in FIG. 11D. These doped zones 408 will act as common point for all the photodiodes.

Figure 11C:
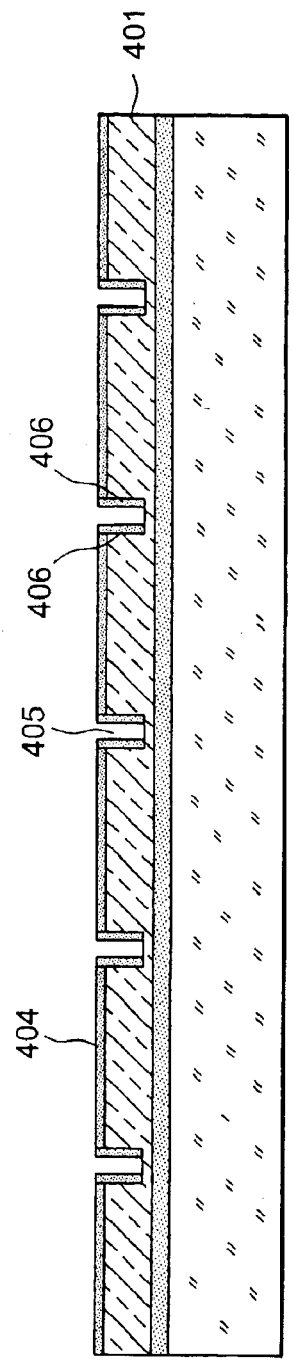
Figure 11D:
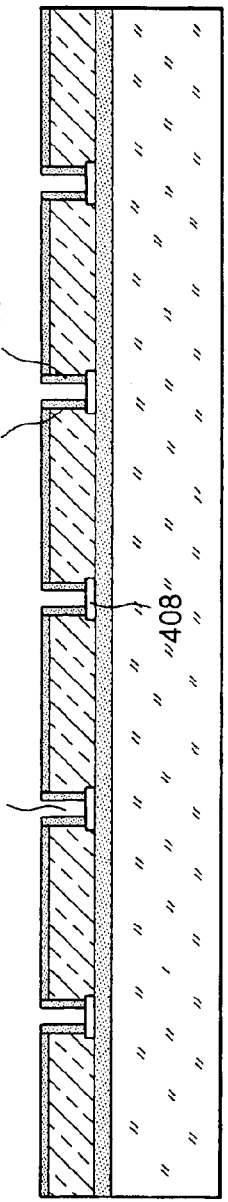
Figure 11E:
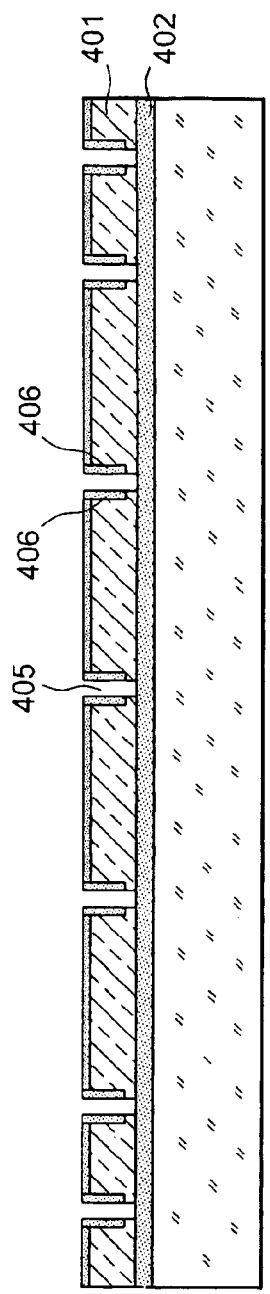

One variant consists of adding an additional etching step of thin silicon layer 401 to the structure shown in FIG. 11C. This additional, anisotropic etching is conducted until buried oxide layer 402 is reached as shown in FIG. 11E. Channel sidewalls 405 are therefore in silicon oxide at their top part and in silicon at their lower part.

Figure 11F:
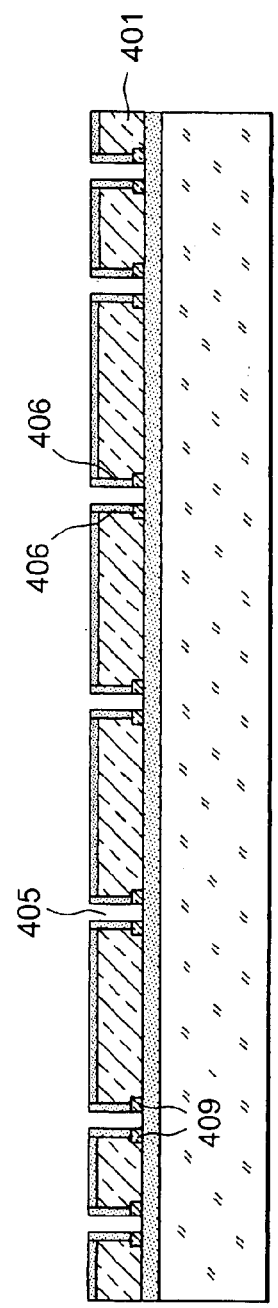

Dopants are then diffused using hot gas into the exposed silicon of channels 405, which makes it possible to obtain doped zones 409 in thin silicon layer 401 as shown in FIG. 11F.

To obtain a device corresponding to FIG. 3 from the structure in FIG. 11D, or a device corresponding to FIG. 4 from the structure in FIG. 11F, steps alreadouty described for the preceding embodiments are used.

To obtain smaller pixels, it is advantageous not to place metal on the conductor walls filling the channels delimiting the pixels. This saves the space taken up by the metal array above the channel array. On the other hand, channels are added along the edge of the wafer to allow for electric connections with the readout circuit. This is shown in FIG. 11G which shows the structure obtained from the structure shown in FIG. 11F.

Figure 11G:
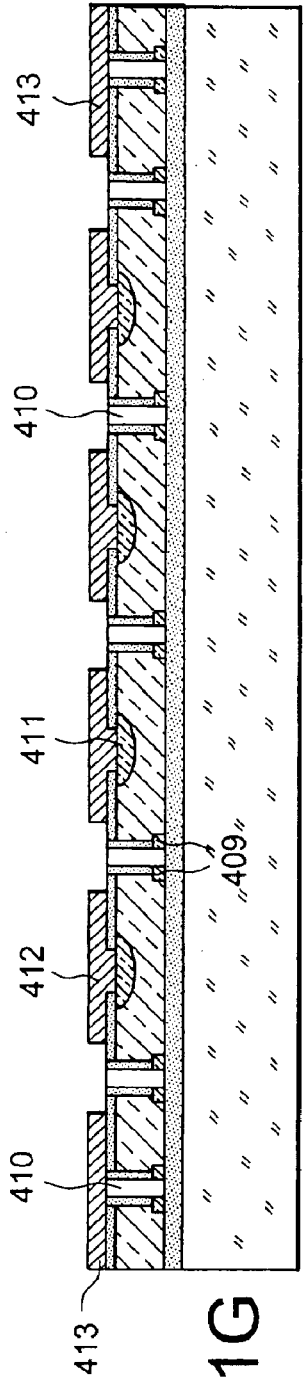

In FIG. 11G, reference 410 denotes the conductor surfaces of the walls, reference 411 denotes the zones doped with a doping type complementary to the doping of zones 409, reference 412 denotes the connection pads contacting doped zones 411, reference 413 denotes the conductor bands electrically connected to conductor walls 410.

Figure 11H:
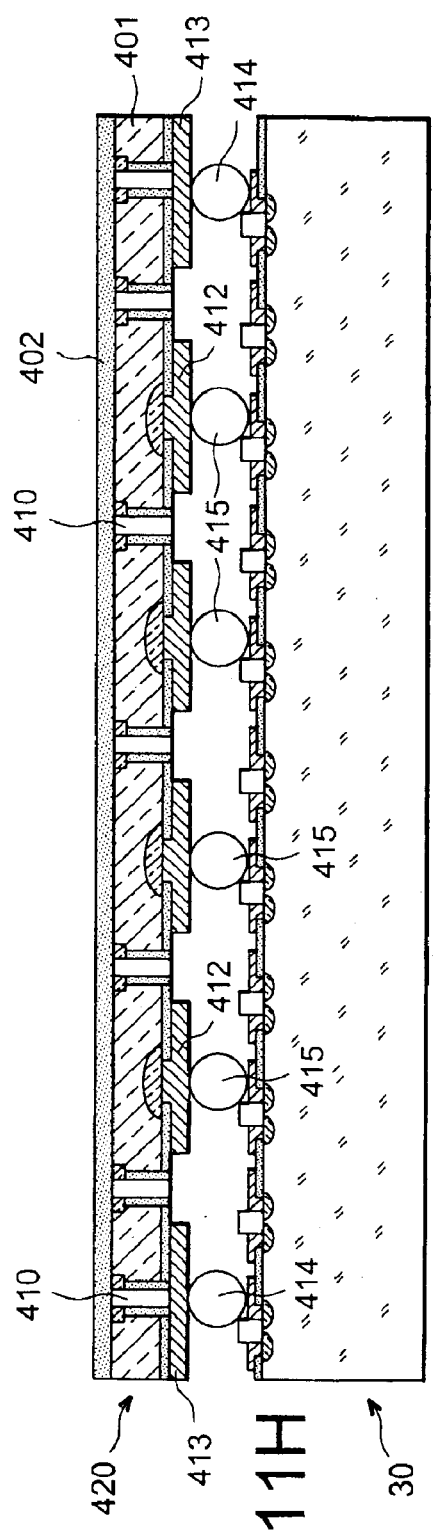

After performing the steps alreadouty described for the preceding embodiments, the structure shown in FIG. 11H is obtained, in which the array of photodetectors 420 is hybridised onto readout circuit 30 alreadouty described. Conductor bands 413 are electrically connected to readout circuit 30 via conductor balls 414 and connection pads 412 are connected to readout circuit 30 by conductor balls 415.

Figure 12A:
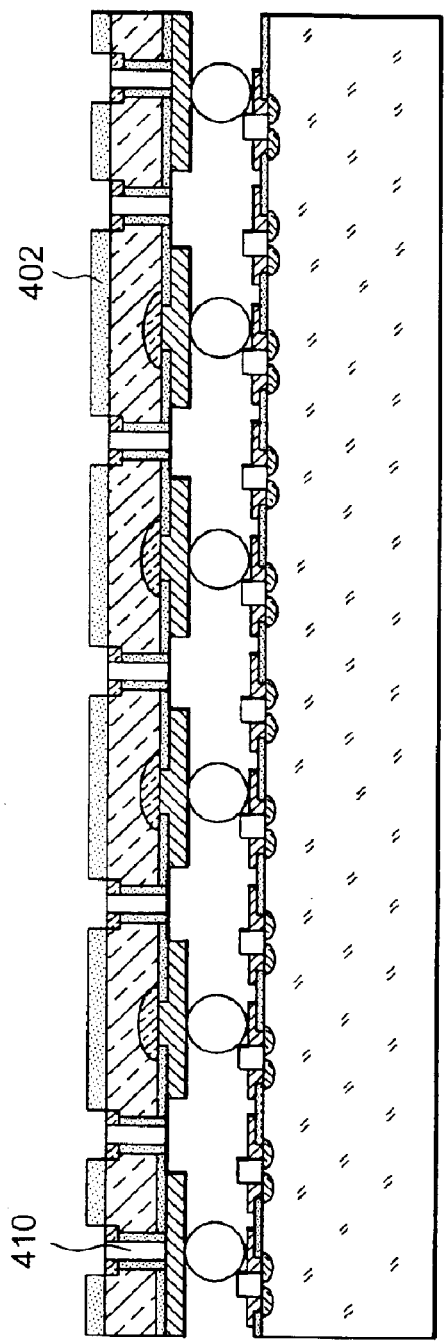
Figure 12B:
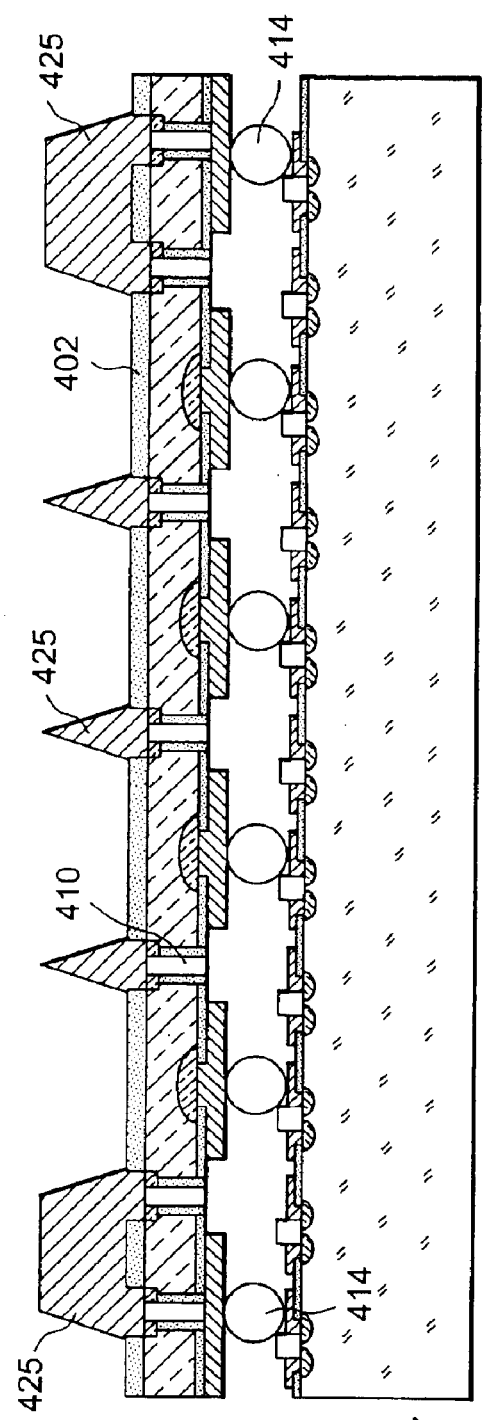

FIGS. 12A and 12B illustrate the fabrication of an array of photodetectors hybridised onto a readout circuit according to the fourth embodiment of the invention. These figures give cross-sectional views.

The structure to be obtained may be fabricated by completing the structure shown in FIG. 11H. A layer of resin is deposited on oxide layer 402 and photolithographed to expose locations of this layer positioned above conductor walls 410. Oxide layer 402 is etched and the resin removed. The structure shown in FIG. 12A is obtained.

A metal layer is then deposited on oxide layer 402. A layer of resin is deposited on the metal layer and is photolithographed. The metal layer is etched controlling the slope of etching. The resin is removed. The structure illustrated in FIG. 12B is obtained in which common electrode 425 ensures the electric connection of conductor walls 410 with readout circuit 30 via fusible balls 414.

FIGS. 13A to 13F illustrate the fabrication of an array of photodetectors hybridised onto a readout circuit according to the fifth embodiment of the invention. These figures give cross-sectional views.

The fabrication process illustrated in these figures only differs from the processes previously described through the sequencing and multiplication of steps but does not differ in principle.

The first steps are identical to those illustrated in FIGS. 9A and 9B. First a SOI substrate 500 is used consisting of a silicon carrier 503 successively carrying a buried oxide layer 502 and a thin silicon layer 501. As in the step shown in FIG. 9B, a surface passivation and protection layer 504 is obtained by oxidation.

Figure 13A:
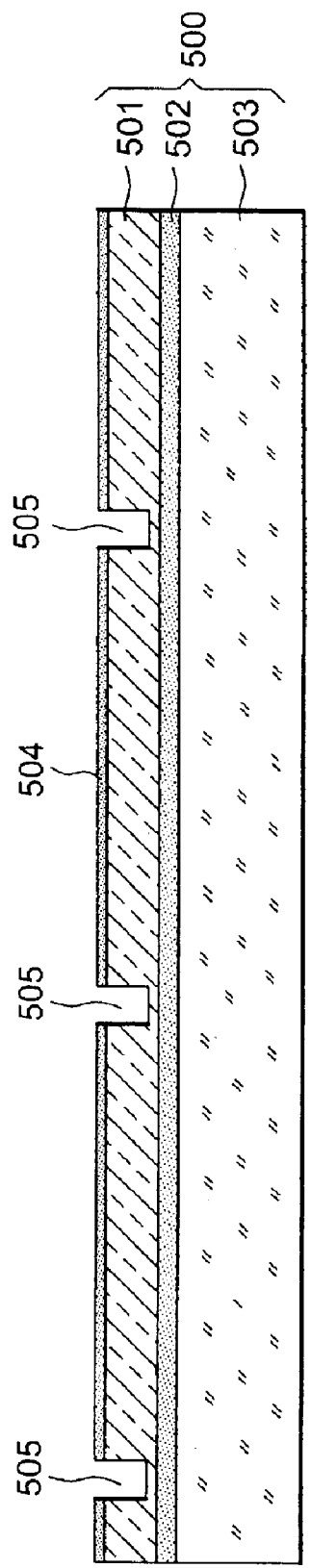

To obtain the structure shown in FIG. 13A, a layer of resin is deposited on oxide layer 504 and photolithographed. Oxide layer 504 is etched at desired locations and the resin layer is removed. Channels 505 are then etched in thin layer 501 without reaching buried oxide layer 502.

Figure 13B:
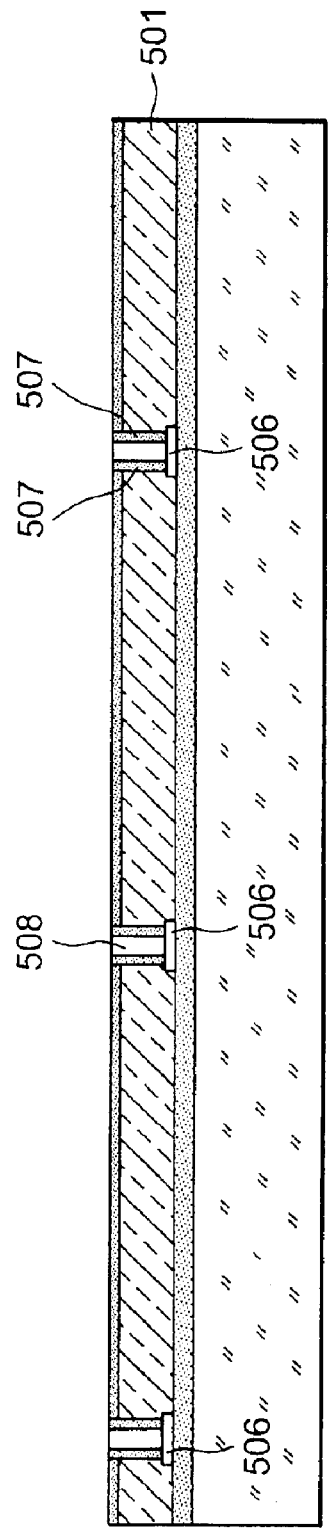

Slight oxidation of the exposed silicon surfaces is then conducted, i.e. in the channels. Anisotropic deoxidisation is performed simply to remove the oxide layer at the bottom of the channels and expose the silicon of thin layer 501. Dopants are then implanted or diffused using gas in the exposed silicon and their diffusion performed. The channels are then filled with doped polysilicon and excess fill is removed by polishing. The structure shown in FIG. 13B is obtained in which reference 506 denotes the doped zones, reference 507 denotes the oxide layers covering the channel sidewalls and reference 508 denotes the conductor walls corresponding to doped zones 506.

The structure is then coated with a resin layer which is photolithographed. Oxide layer 504 is etched at determined locations between the channels previously made and the resin layer is removed. Channels 509 are then etched in thin layer 501 without reaching buried oxide layer 502. This is shown in FIG. 13C.

Slight oxidation of the exposed silicon surfaces is then performed, i.e. in channels 509. Anisotropic deoxidisation is then performed simply to remove the oxide layer at the bottom of the channels and expose the silicon of thin layer 501. The exposed silicon is then etched as far as buried oxide layer 502. Dopants are then implanted or diffused using gas, these dopants being complementary to the dopants of doped zones 506 and diffusion annealing is conducted. Channels 509 are then filled with doped polysilicon and excess fill is removed by polishing. The structure shown in FIG. 13D is obtained in which reference 510 denotes the new doped zones and reference 511 denotes the corresponding conductor walls.

Subsequently steps are conducted which cannot be illustrated in these cross-sectional views, whose purpose is to form electrically insulating channels in a direction perpendicular to channels 505 and 509. These steps are surface oxidation, resin layer deposition, photolithography of the deposited resin, etching of the exposed oxide layer, resin removal, etching of exposed silicon as far as the buried oxide layer, oxidation, channel filling, surface polishing to remove excess fill, depositing a further layer of resin followed by photolithography to etch the oxide formed on the conductor walls in polysilicon, and finally resin removal.

A metal layer is then deposited on the structure followed by a layer of resin. The resin layer is photolithographed and the metal etched so as only to maintain the connection pads on the conductor walls. The resin is removed. Fusible balls are then formed on the connection pads. The structure shown in FIG. 13E is obtained in which reference 515 denotes a connection pad corresponding to conductor wall 508 and in which reference 516 denotes a connection pad corresponding to conductor wall 511. Reference 517 denotes a conductor ball corresponding to connection pad 515 and reference 518 denotes a conductor ball corresponding to connection pad 516.

After performing the steps alreadouty described for the preceding embodiments, the structure shown in FIG. 13F is obtained in which the array of photodetectors 520 is hybridised onto readout circuit 30 alreadouty described.

Figure 7:
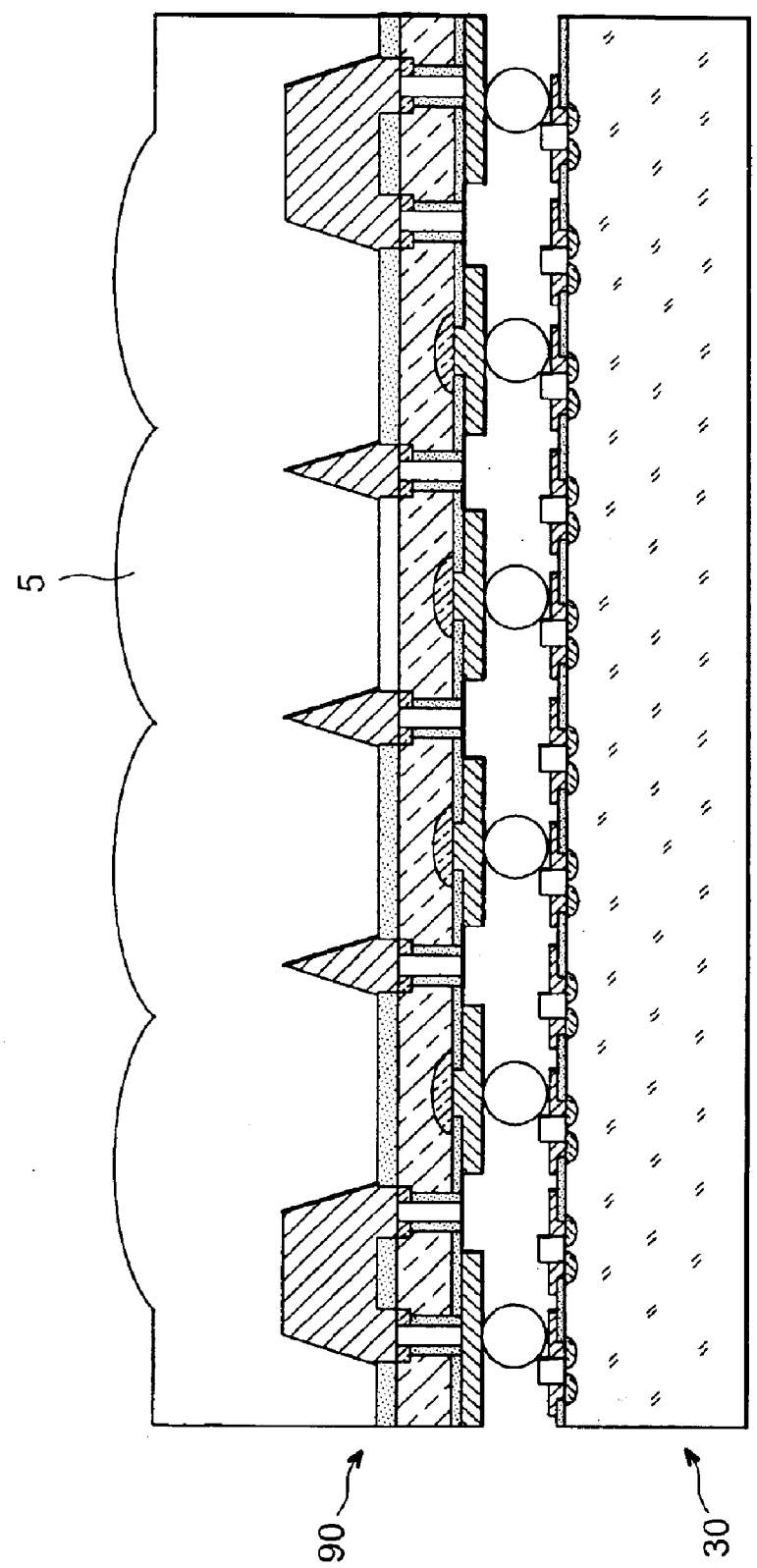
Figure 8:
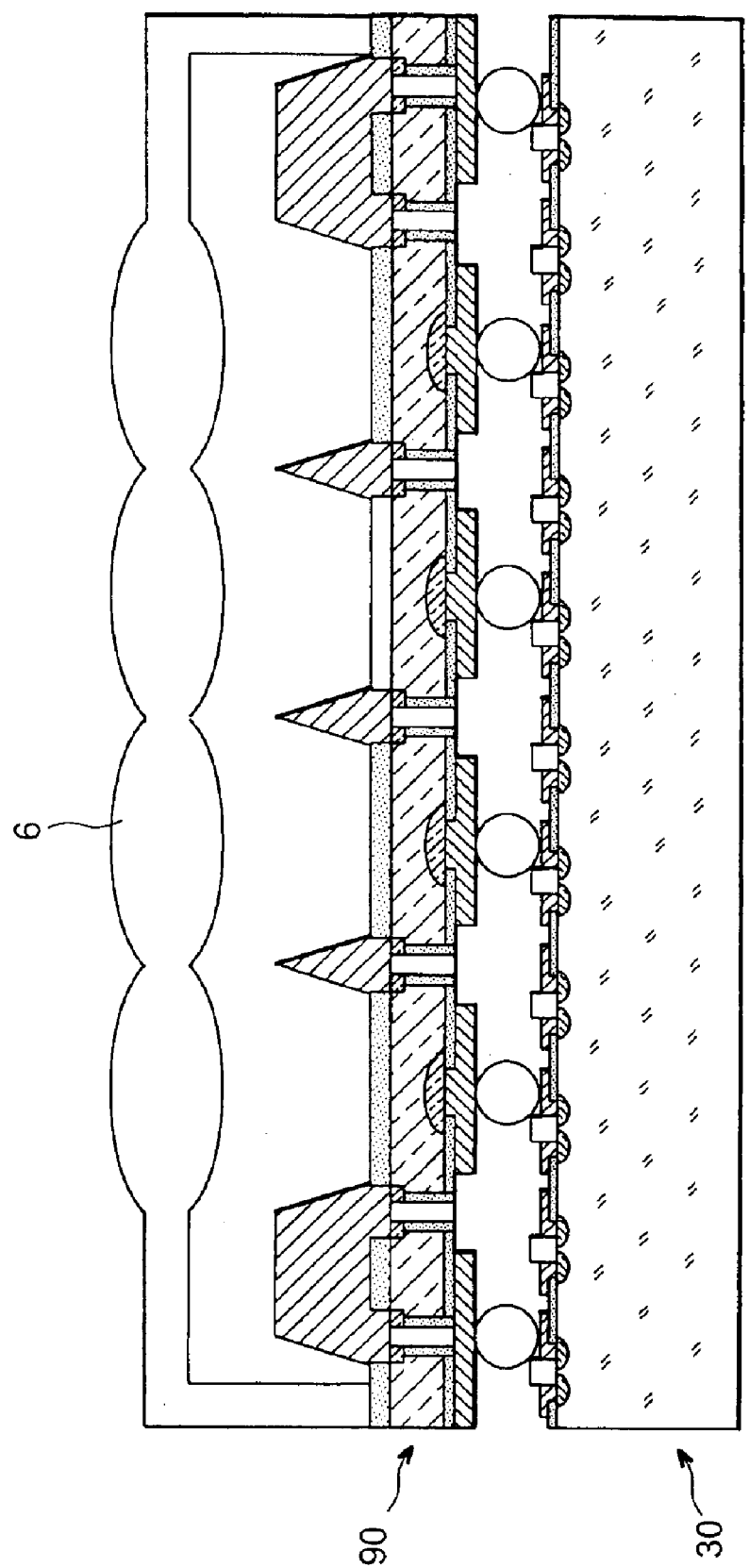

The techniques to achieve the assemblies illustrated in FIGS. 7 and 8 are most varied. They must be compatible with the fabrication processes previously used. The problems which may arise relate to overheating at high temperature and constraints due to cooling materials of different type. Since in general antireflection layers or filter layers are formed by thin layer vapour deposition, overheating is very limited. And as the structures of the invention are made from hard materials, compatibility does not give rise to any problems. Similarly, any spreadouting or etching of polymer or plastic is compatible with these structures provided care is taken to fill in the space separating the hybridised wafers. Bonding of the parts does not give rise to any problems either.

Variants of these structures are possible by simply replacing zones 16, 17 (see FIG. 1), 56 (see FIG. 2), 76 (see FIG. 3) and 96 (see FIG. 4), which are single doped zones, by zones with double or triple doping of different depths and of identical or complementary type.

The sizes of the structures of the invention vary according to application. The thickness of the photosensitive wafer ranges from a few $\mu$m to a few dozen $\mu$m. The width of the pixels is in the region of the thickness of the photosensitive wafer. The width of the walls is in the region of one tenth of the thickness of the wafer, or even less since it is sought to minimise their width. The size of the doped zones is the same as the pixel size, or less, and may be very thin (less than 0.1 $\mu$m). The arrays may contain a few dozen to a few million pixels.

What is claimed is:

1. Array of photodetectors to be hybridised on a readout circuit and comprising:
    a wafer in semiconductor material having one surface receiving light to be detected and an opposite hybridisation surface, the wafer being divided into pixels, each pixel forming a photodetector, the hybridisation surface having connection pads with which to hybridise the array of photodetectors to the readout circuit,
    wherein the pixels are separated from one another by walls formed crosswise over an entire thickness of the wafer.

2. Array of photodetectors as in claim 1, wherein each photodetector comprises a zone doped according to a first doping type and in electric contact with a corresponding connection pad on the hybridisation surface, each photodetector further comprising a zone doped according to a second doping type complementary to the first doping type and in electric contact with an electrode common to all the photodetectors and carried by the hybridisation surface, the walls having a surface electrically insulated from the photodetectors.

3. Array of photodetectors as in claim 1, wherein each photodetector comprises a zone doped according to a first doping type and in electric contact with a corresponding connection pad on the hybridisation surface, each photodetector further comprising a zone doped according to a second doping type complementary to the first doping type and in electric contact with a corresponding connection pad on the hybridisation surface, the walls having a surface electrically insulated from the photodetectors.

4. Array of photodetectors as in claim 1, wherein each photodetector comprises a zone doped according to a first doping type and in electric contact with a corresponding connection pad on the hybridisation surface, each photodetector further comprising a zone doped according to a second doping type complementary to the first doping type and in electric contact with electric conductors of the walls, the wall electric conductor means being connected to a common electrode.

5. Array of photodetectors as in claim 4, wherein the common electrode is carried by the hybridisation surface of the array of photodetectors.

6. Array of photodetectors as in claim 4, wherein the zone doped according to the second doping type extends over the entire thickness of the wafer in semiconductor material.

7. Array of photodetectors as in claim 6, wherein each photodetector further comprises a layer of the wafer in semiconductor material, adjacent to the light receiving surface, doped according to the second doping type.

8. Array of photodetectors as in claim 4, wherein, for walls whose summit does not reach the light receiving surface, the zone doped according to the second doping type is located between the summit and the light receiving surface.

9. Array of photodetectors as in claim 4, wherein the zone doped according to the second doping type is located close to the light receiving surface.

10. Array of photodetectors as in claim 4, wherein said common electrode is carried by the light receiving surface, and further comprising an electric connection passing through the wafer in semiconductor material for connecting the common electrode to a conductor band located on the hybridisation surface.

11. Array of photodetectors as in claim 10, wherein the common electrode comprises electric conductors having a shape enabling reflectance of the light to be detected towards portions of the receiving surface devoid of electric conductors.

12. Array of photodetectors as in claim 11, wherein the shape of the electric conductors is a point directed towards the light to be detected.

13. Array of photodetectors as in claim 1, wherein each photodetector comprises a zone doped according to a first doping type and a zone doped according to a second doping type complementary to the first doping type, the doped zones being located close to the light receiving surface and being connected to corresponding connection pads on the hybridisation surface by an electric conductor provided in the walls.

14. Array of photodetectors as in claim 13, wherein the zones doped according to the first doping type correspond to walls having a summit that does not reach the light receiving surface, the zones doped according to the first doping type then being located between summits of the walls and the light receiving surface, the zones doped according to the second doping type corresponding to walls having a summit that reaches the light receiving surface.

15. Array of photodetectors as in claim 13, wherein the doped zones correspond to walls having a summit that does not reach the light receiving surface, the doped zones then being located between the wall summits and the light receiving surface.

16. Array of photodetectors as in claim 13, wherein the doped zones correspond to walls having a summit that reaches the light receiving surface.

17. Array of photodetectors as in claim 1, wherein the light receiving surface carries at least one optic member.

18. Array of photodetectors as in claim 17, wherein the at least one optic member is chosen from among an antireflection layer, a colored filter, and a light concentration system.

* * * * *